(12) United States Patent
Shrivastava et al.

(10) Patent No.: US 8,785,968 B2
(45) Date of Patent: Jul. 22, 2014

(54) SILICON CONTROLLED RECTIFIER (SCR) DEVICE FOR BULK FINFET TECHNOLOGY

(71) Applicants: Mayank Shrivastava, Unterhaching (DE); Harald Gossner, Riemerling (DE)

(72) Inventors: Mayank Shrivastava, Unterhaching (DE); Harald Gossner, Riemerling (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/646,799

(22) Filed: Oct. 8, 2012

(65) Prior Publication Data
US 2014/0097465 A1    Apr. 10, 2014

(51) Int. Cl.
*H01L 29/66* (2006.01)
(52) U.S. Cl.
USPC .................. 257/133; 257/336; 257/E27.016; 438/135
(58) Field of Classification Search
USPC .................. 257/133, 336, E27.016; 438/135
See application file for complete search history.

(56) References Cited

U.S. PATENT DOCUMENTS

| | | | |
|---|---|---|---|
| 6,909,149 B2 | 6/2005 | Russ et al. | |
| 7,638,370 B2 | 12/2009 | Gossner et al. | |
| 2004/0207021 A1 | 10/2004 | Russ et al. | |
| 2005/0035415 A1 | 2/2005 | Yeo et al. | |
| 2007/0012945 A1* | 1/2007 | Sugizaki | 257/124 |
| 2008/0067587 A1* | 3/2008 | Gossner et al. | 257/336 |
| 2009/0206367 A1 | 8/2009 | Gauthier, Jr. et al. | |
| 2010/0207161 A1 | 8/2010 | Shrivastava et al. | |

FOREIGN PATENT DOCUMENTS

| | | |
|---|---|---|
| JP | 2002094012 A | 3/2002 |
| JP | 2002329792 A | 11/2002 |
| WO | 2004051749 A1 | 6/2004 |
| WO | 2010032174 A1 | 3/2010 |

OTHER PUBLICATIONS

Griffoni, et al. "Next Generation Bulk FinFET Devices and Their Benefits for ESD Robustness" EOS/ESD Symposium Published 2009.
Manavizadeh, et al. "Performance Assessment of Nanoscale Field-Effect Diodes" IEEE Transactions on Electron Devices, vol. 58, No. 8 Published Aug. 2011.
Thijs, et al. "On Gated Diodes for ESD Protection in Bulk FinFET CMOS Technology" EOS/ESD Symposium Published Sep. 2011.
International Search Report and Written Opinion of the International Searching Authority Dated Jan. 27, 2014 for International Application No. PCT/EP2013/070942.

* cited by examiner

*Primary Examiner* — Thao X Le
*Assistant Examiner* — Matthew Gordon
(74) *Attorney, Agent, or Firm* — Eschweiler & Associates, LLC

(57) ABSTRACT

Some aspects relate to a semiconductor device disposed on a semiconductor substrate. The device includes an STI region that laterally surrounds a base portion of a semiconductor fin. An anode region, which has a first conductivity type, and a cathode region, which has a second conductivity type, are arranged in an upper portion of the semiconductor fin. A first doped base region, which has the second conductivity type, is arranged in the base of the fin underneath the anode region. A second doped base region, which has the first conductivity type, is arranged in the base of the fin underneath the cathode region. A current control unit is arranged between the anode region and the cathode region. The current control unit is arranged to selectively enable and disable current flow in the upper portion of the fin based on a trigger signal. Other devices and methods are also disclosed.

20 Claims, 12 Drawing Sheets

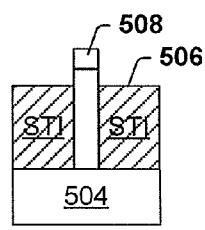 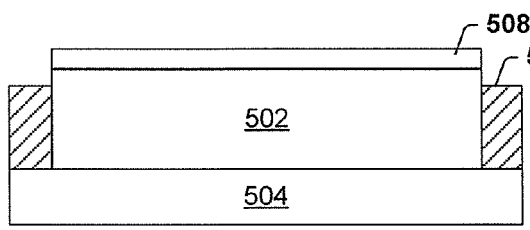 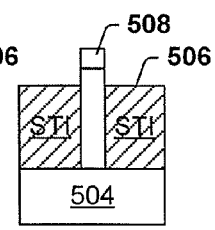
Fig. 5A  Fig. 5B  Fig. 5C
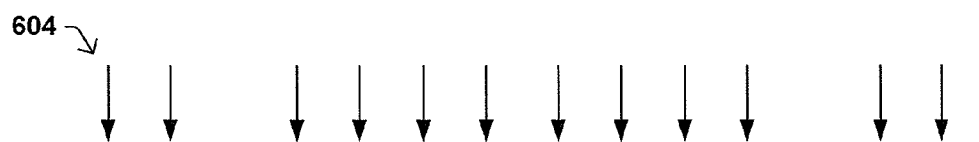
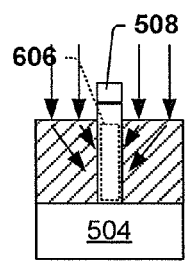 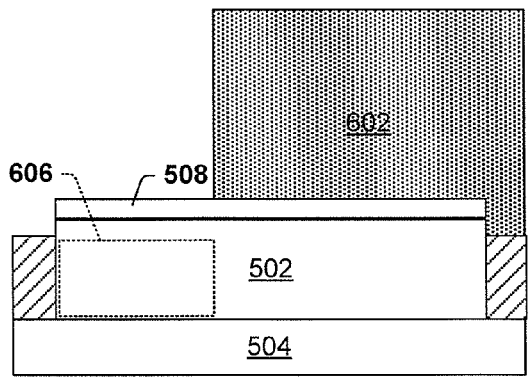 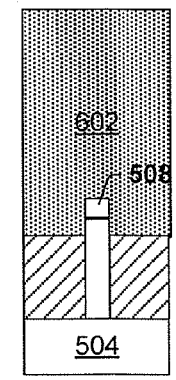
Fig. 6A  Fig. 6B  Fig. 6C

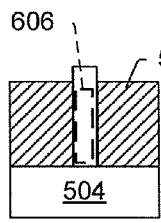 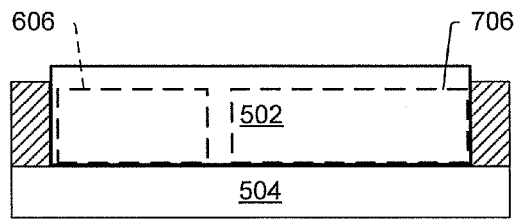 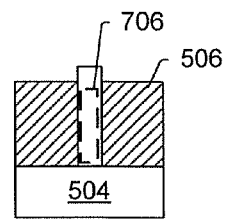
Fig. 9A          Fig. 9B          Fig. 9C
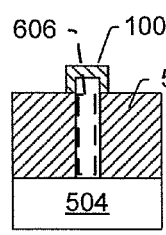 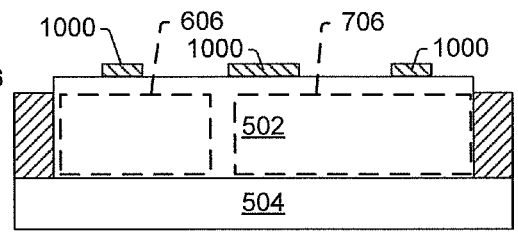 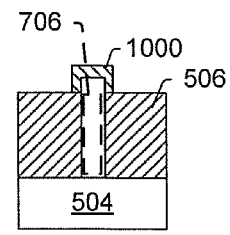
Fig. 10A         Fig. 10B         Fig. 10C

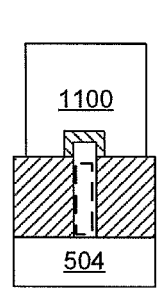 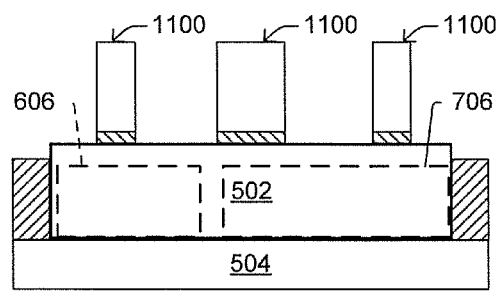 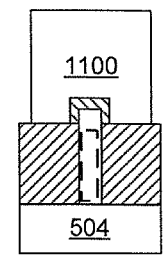
Fig. 11A  Fig. 11B  Fig. 11C
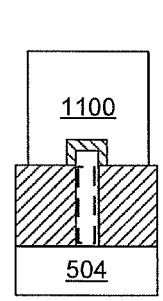 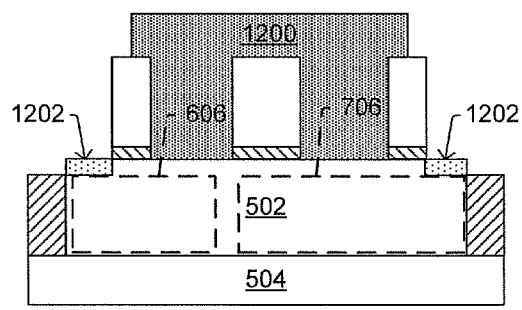 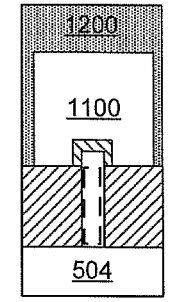
Fig. 12A  Fig. 12B  Fig. 12C

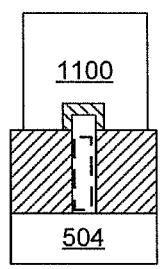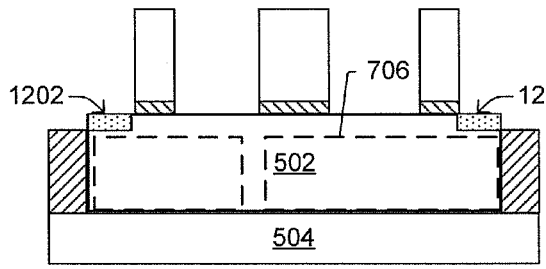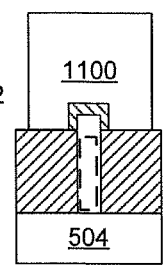
Fig. 13A     Fig. 13B     Fig. 13C
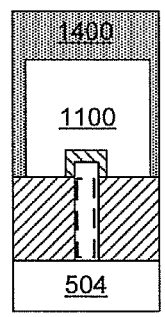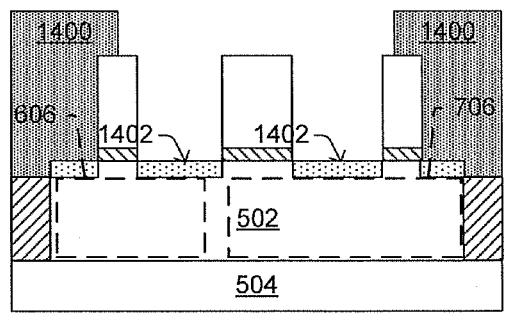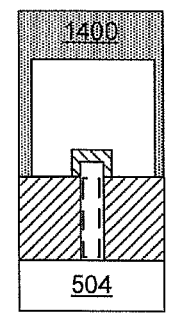
Fig. 14A     Fig. 14B     Fig. 14C

US 8,785,968 B2

SILICON CONTROLLED RECTIFIER (SCR) DEVICE FOR BULK FINFET TECHNOLOGY

BACKGROUND

A conventional planar complementary metal oxide semiconductor (CMOS) transistor has four parts: a source, a drain, a channel disposed between the source and drain, and a gate disposed over the channel to control the channel. In planar CMOS transistors, the source, drain, and channel are formed by implanting ions into a planar semiconductor substrate, and the gate is then formed over a surface of the semiconductor substrate so as to overlie the channel. Engineers continuously seek to shrink the size of such transistors over successive generations of technology to "pack" more transistors into a given unit area, which provides consumers with devices that exhibit improved functionality.

One of the more recent advances in this continuing effort to shrink the size of CMOS transistors is the advent of fin field effect transistors (FinFETs). Unlike planar CMOS transistors where the source, drain, and channel are formed in a planar substrate; in FinFETs the source, drain, and channel region are formed in a thin slice of semiconductor material (i.e., a "fin"), which extends upward from the semiconductor substrate. A chip in advanced CMOS consists of various blocks, including robust electrostatic discharge (ESD) protection. This patent application presents improved silicon controlled rectifier (SCR) devices for bulk FinFET technology.

BRIEF DESCRIPTION OF THE DRAWINGS

FIGS. 5A, 5B, and 5C show a cross-sectional end view, cross-sectional longitudinal view, and cross-sectional end view, respectively, illustrating at a stage of manufacture in accordance with some embodiments.

FIGS. 6A, 6B, and 6C show a cross-sectional end view, cross-sectional longitudinal view, and cross-sectional end view, respectively, illustrating at a stage of manufacture in accordance with some embodiments.

FIGS. 9A, 9B, and 9C show a cross-sectional end view, cross-sectional longitudinal view, and cross-sectional end view, respectively, illustrating at a stage of manufacture in accordance with some embodiments.

FIGS. 10A, 10B, and 10C show a cross-sectional end view, cross-sectional longitudinal view, and cross-sectional end view, respectively, illustrating at a stage of manufacture in accordance with some embodiments.

FIGS. 11A, 11B, and 11C show a cross-sectional end view, cross-sectional longitudinal view, and cross-sectional end view, respectively, illustrating at a stage of manufacture in accordance with some embodiments.

FIGS. 12A, 12B, and 12C show a cross-sectional end view, cross-sectional longitudinal view, and cross-sectional end view, respectively, illustrating at a stage of manufacture in accordance with some embodiments.

FIGS. 13A, 13B, and 13C show a cross-sectional end view, cross-sectional longitudinal view, and cross-sectional end view, respectively, illustrating at a stage of manufacture in accordance with some embodiments.

FIGS. 14A, 14B, and 14C show a cross-sectional end view, cross-sectional longitudinal view, and cross-sectional end view, respectively, illustrating at a stage of manufacture in accordance with some embodiments.

DETAILED DESCRIPTION

Figure 1A:
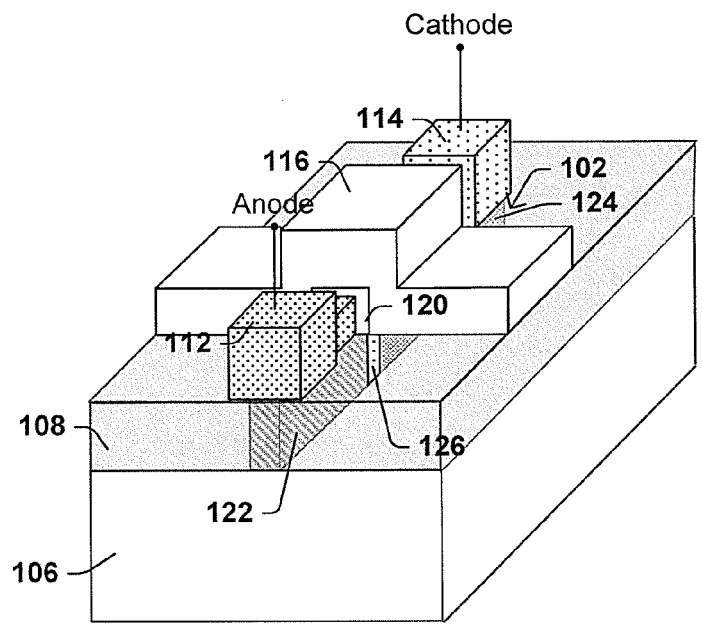
FIG. 1A shows a perspective view of an SCR for bulk FinFET having a single gate electrode.

The present disclosure will now be described with reference to the attached drawing figures, wherein like reference numerals are used to refer to like elements throughout, and wherein the illustrated structures and devices are not necessarily drawn to scale. Further, to the extent that some illustrated aspects may be described with reference to a Fin field effect transistor (FinFET), it will be appreciated that the term FinFET includes, but is not limited to: tri-gate transistors, omega transistors, multi-gate transistors (MUGFETs) and the like, all of which are contemplated as falling within the scope of the present disclosure.

Aspects of the present disclosure relate to SCRs in bulk FinFET technology. As used herein, an "SCR" is a three terminal device in which forward current flow is selectively enabled between two device terminals—so called anode and cathode terminals—depending on the state of a trigger signal applied to an enable terminal of the SCR. The SCR acts as a diode in that current flow is essentially blocked in one direction (e.g., from cathode to anode), whereas current flow is enabled in the other direction (e.g., from anode to cathode) so long as the state of the trigger signal enables current flow. Whereas conventional SCRs are formed in planar topologies, the present SCRs are formed in FinFET topologies with improved features.

Figure 1B:
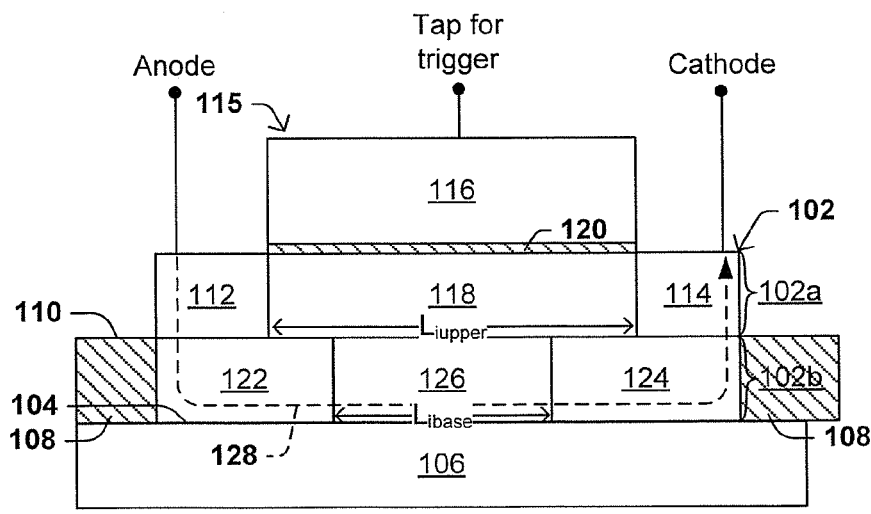
FIG. 1B shows a cross-sectional view of the SCR of FIG. 1A.

FIG. 1A shows a perspective view of an SCR 100 in bulk FinFET technology, while FIG. 1B shows a cross-sectional view of the SCR 100. FIGS. 1A-1B are now referred to concurrently. SCR 100 includes a semiconductor fin 102 extending upwardly from an upper surface 104 of semiconductor substrate 106. Shallow trench isolation (STI) region 108, which is made of a dielectric material (e.g., silicon dioxide), has an upper surface 110 that divides the semiconductor fin 102 into an upper portion 102a and a base portion 102b. The STI region 108 laterally surrounds the base fin portion 102b, while the upper fin portion 102a remains above the upper surface 110 of STI region 108.

Upper fin portion 102a includes an anode 112 having a first conductivity type (e.g., P+) and a cathode 114 having a second conductivity type (e.g., N+). The anode 112 and cathode 114 are arranged at opposing ends of the fin 102. A current control element 115 is arranged between the anode 112 and cathode 114 and is adapted to selectively enable and disable current flow in the upper fin portion 102a based on a trigger signal. In FIG. 1A-1B's example, the current control element 115 includes a conductive gate electrode 116. The conductive gate electrode 116 is arranged to traverse over the fin 102 between the anode 112 and cathode 114. An intrinsic upper fin region 118 can be arranged under the gate electrode 116, and a gate dielectric 120 can electrically isolate the intrinsic upper fin region 118 from gate electrode 116. The conductive gate electrode 116 is often made of metal, and the substrate often has the first conductivity type (e.g., P+). Although FIG. 1A-1B show current control element 115 as conductive gate electrode 116, in other embodiments described further below the current control element 115 can include a doped region in the upper fin portion 102a to enable/disable current flow.

Base fin portion 102b includes a first doped base region 122 having the second conductivity type (e.g., N−) under the anode 112. Under the cathode 114, the base fin portion 102b includes a second doped base region 124 having the first conductivity type (e.g., P−). An intrinsic base fin region 126 can be arranged under the gate electrode 116 between the first and second base regions 122, 124. Often, the intrinsic base fin region 126 has a length, $L_{ibase}$, that is shorter than a length, $L_{iupper}$, of the intrinsic upper fin region 118. Because intrinsic silicon has a lower conductivity than doped silicon, this arrangement tends to promote current flow through the less resistive, base fin region 126; although some lesser amount of current can still flow in the more resistive, upper intrinsic fin region 118 as well.

Figure 1C:
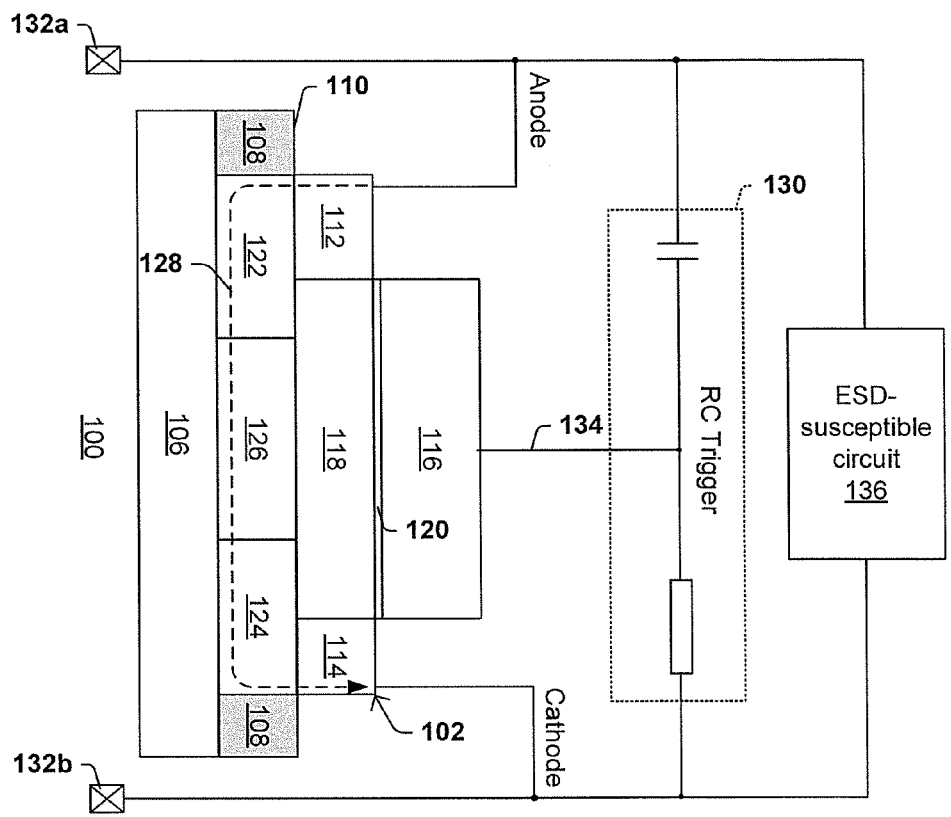
FIG. 1C shows the SCR of FIG. 1B arranged in an electrostatic discharge (ESD) protection circuit.

During operation, current can flow from the anode 112, through the base fin portion 102b and out the cathode 114 (depending on the biases applied to the SCR terminals), as shown by arrow 128 (FIG. 1B). In many implementations, the SCR 100 can facilitate reliable ESD protection when the conductive gate electrode 116 acts as a tap for a trigger signal 134. In FIG. 1C, for example, an RC trigger circuit 130 provides the trigger signal 134, although it will be appreciated that Zener triggering or other non-RC triggering circuits can also be used. In such a configuration, in the absence of an ESD pulse and with a voltage bias across first and second circuit nodes 132a, 132b, the trigger signal 134l has a first voltage that disables current flow through the SCR 100. In such a state, the SCR provides electrical isolation between the anode 112 and cathode 114, and signals from the first and second circuit nodes 132a, 132b are provided directly to corresponding nodes on ESD-susceptible IC 136 without being diverted through SCR 100. When an ESD pulse is impingent, however, the RC trigger element 130 provides a voltage pulse to the conductive gate electrode 116 (e.g., pulls the conductive gate electrode to ground), which enables current flow from anode 112 to cathode 114 to dissipate the ESD pulse through the SCR device 100. In this way, the SCR device 100 can effectively divert energy of an impingent ESD pulse through the SCR such that the ESD energy is safely diverted from the ESD-susceptible circuit 136.

Figure 2A:
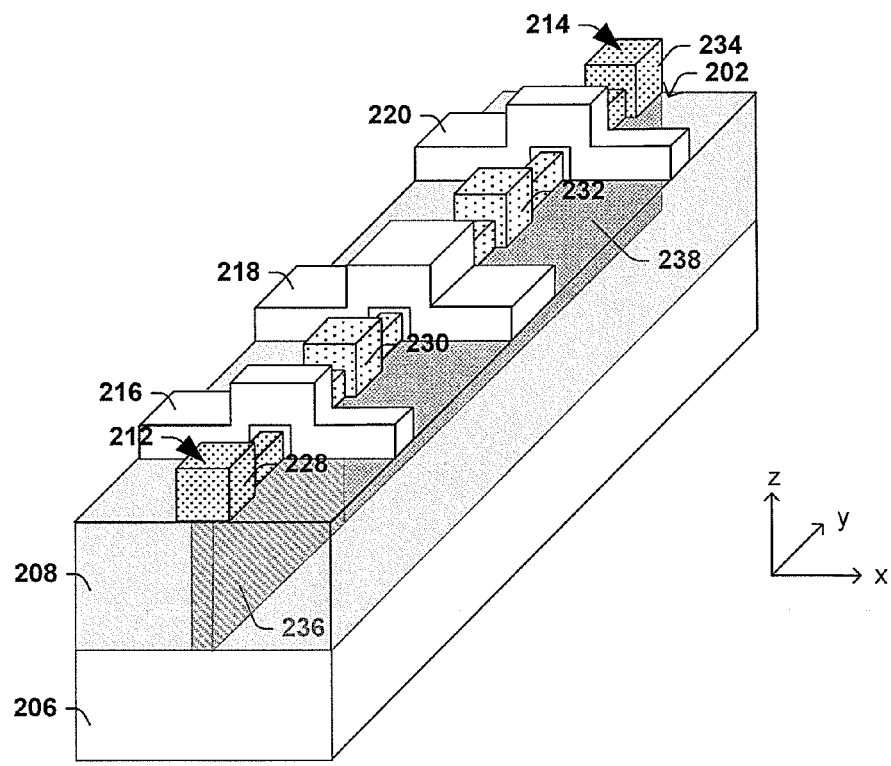
FIG. 2A shows a perspective view of an SCR for bulk FinFET having three gate electrodes.
Figure 2B:
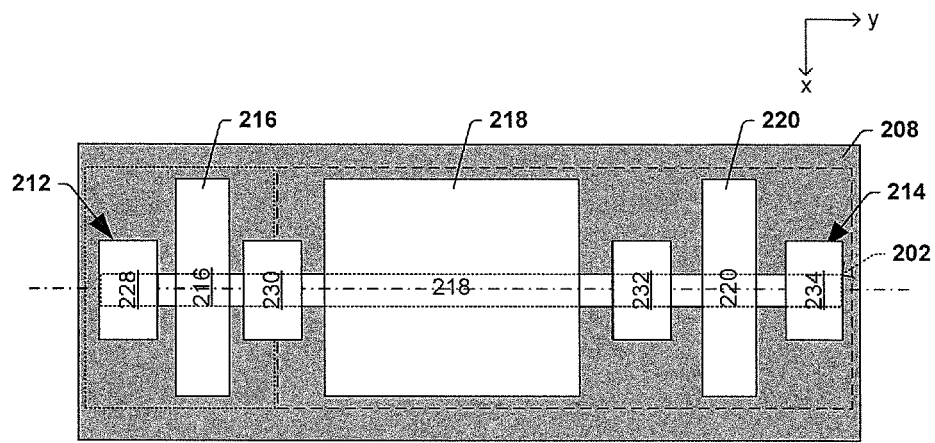
FIG. 2B shows a top view of the SCR of FIG. 2A.
Figure 2C:
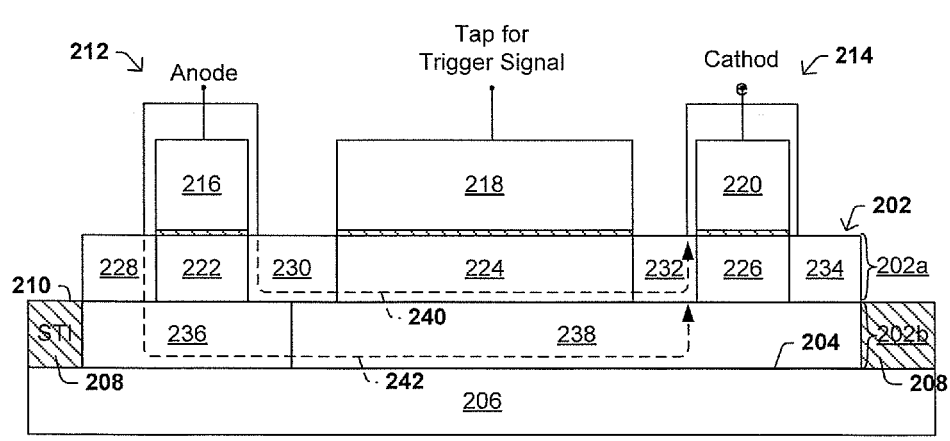
FIG. 2C shows a cross-sectional view of the SCR of FIG. 2A.

FIG. 2A illustrates another SCR 200 in perspective view, while FIG. 2B and FIG. 2C provide a top view and cross-sectional view, respectively, of SCR 200. FIGS. 2A-2C are now referred to concurrently. Like FIG. 1's SCR, FIG. 2's SCR 200 includes a semiconductor fin 202 extending upwardly (e.g., in z-direction) from an upper surface 204 of semiconductor substrate 206 and extending in a first direction (e.g., in x-direction). Shallow trench isolation (STI) region 208, which is made of a dielectric material (e.g., silicon dioxide), has an upper surface 210 that divides the semiconductor fin 202 into an upper portion 202a and a base portion 202b. The STI region 208 laterally surrounds the base fin portion 202b, while the upper fin portion 202a remains above the upper surface 210 of STI region 208.

In FIGS. 2A-2C, SCR 200 includes an anode 212 and 214 cathode at opposite ends of the upper fin portion 202a. First, second, and third conductive gates (218, 216, 220, respectively) traverse over the length of the fin 202 in a second direction (e.g., x-direction), which is perpendicular to the first direction (e.g., y-direction). Intrinsic upper fin regions (224, 222, 226) can be arranged under respective conductive gates (218, 216, 220, respectively). Thus, the anode 212 can include a first doped upper fin region 230 having a second conductivity type (e.g., N+), the first intrinsic upper fin region 222, and a third doped upper fin region 228 having a first conductivity type (e.g., P+). The cathode 214 can include a second doped upper fin region 232 having the second conductivity type (e.g., N+), the third intrinsic upper fin region 226, and a fourth doped upper fin region 234 having the first conductivity type (e.g., P+). In FIGS. 2A-2C, the gate electrodes 216, 218, and 220, as well as the first doped upper fin region 230 act as a current control element.

The base fin region 202b includes first doped base fin region 236, which can have the second conductivity type (e.g., N−), and also includes second doped base fin region 238, which can have the first conductivity type (e.g., P−). Further, rather than meeting at a p-n junction as illustrated, in other un-illustrated implementations the first and second doped base fin regions 236, 238 are separated by a region of intrinsic semiconductor material under the gate electrode 218. Whether a p-n junction is present (or whether intrinsic silicon under the gate separates the punch-through blocking region from the drain extension region) depends on the VT desired for the FinFET 200.

During operation, current can selectively flow from anode 212 to cathode 214, for example as shown by arrows 240, 242 (FIG. 2C), depending on the bias applied to conductive gate electrodes 216, 218, 220.

Figure 2D:
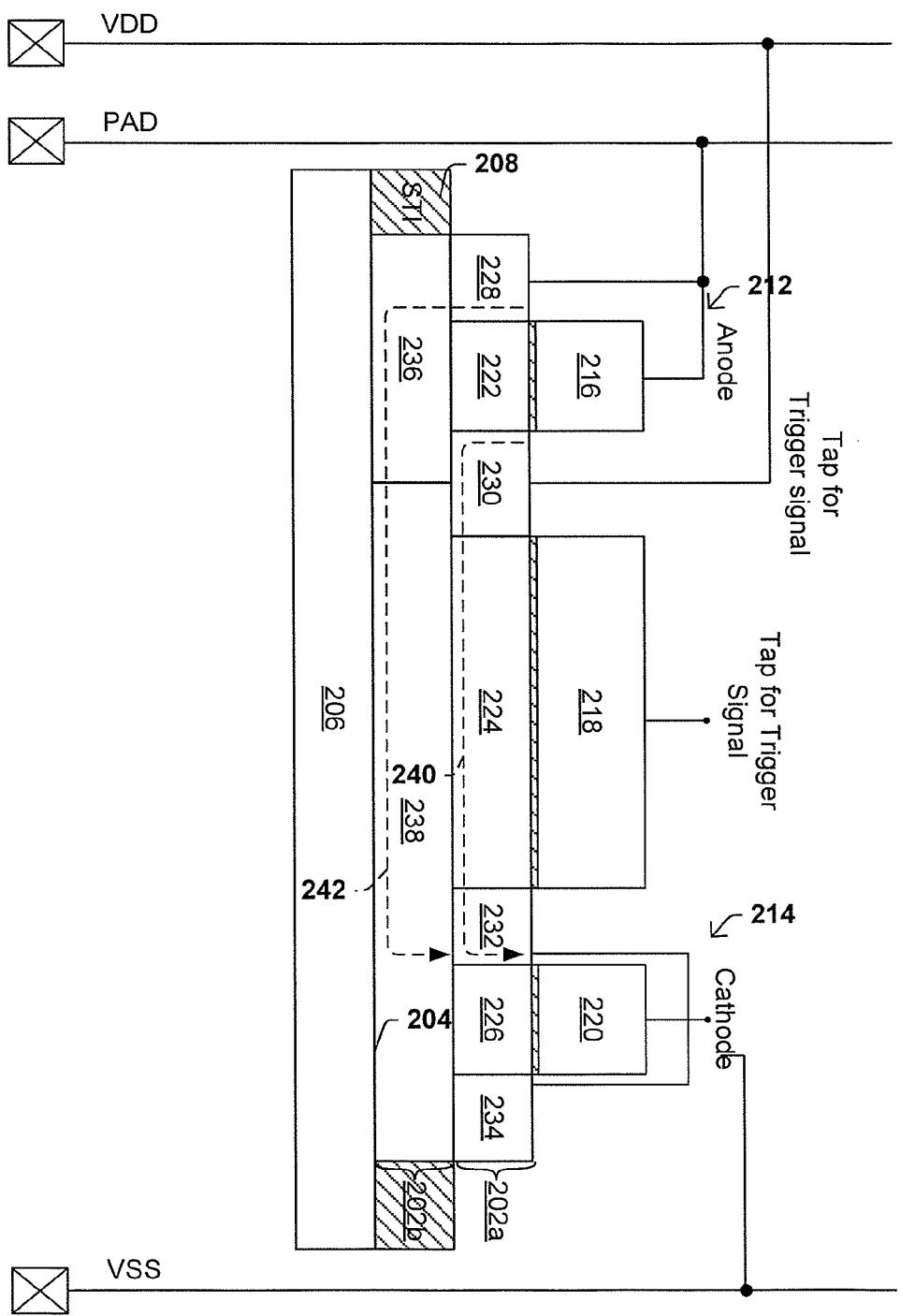
FIG. 2D shows the SCR of FIG. 2A arranged in a transient triggered orientation for ESD protection.

FIG. 2D illustrates SCR device 200 in a transient triggered configuration for ESD protection between an I/O pad and ground (VSS). In this configuration, the second doped upper fin region 230, which is tied to VDD pin, acts as the current control element. In the absence of an ESD pulse, the SCR device is in a highly resistive state. When an ESD pulse is impingent, however, the SCR device is enabled and current flows through the device as shown by arrows 240, 242, to help shunt the energy of the ESD pulse to protect devices on chip.

Figure 2E:
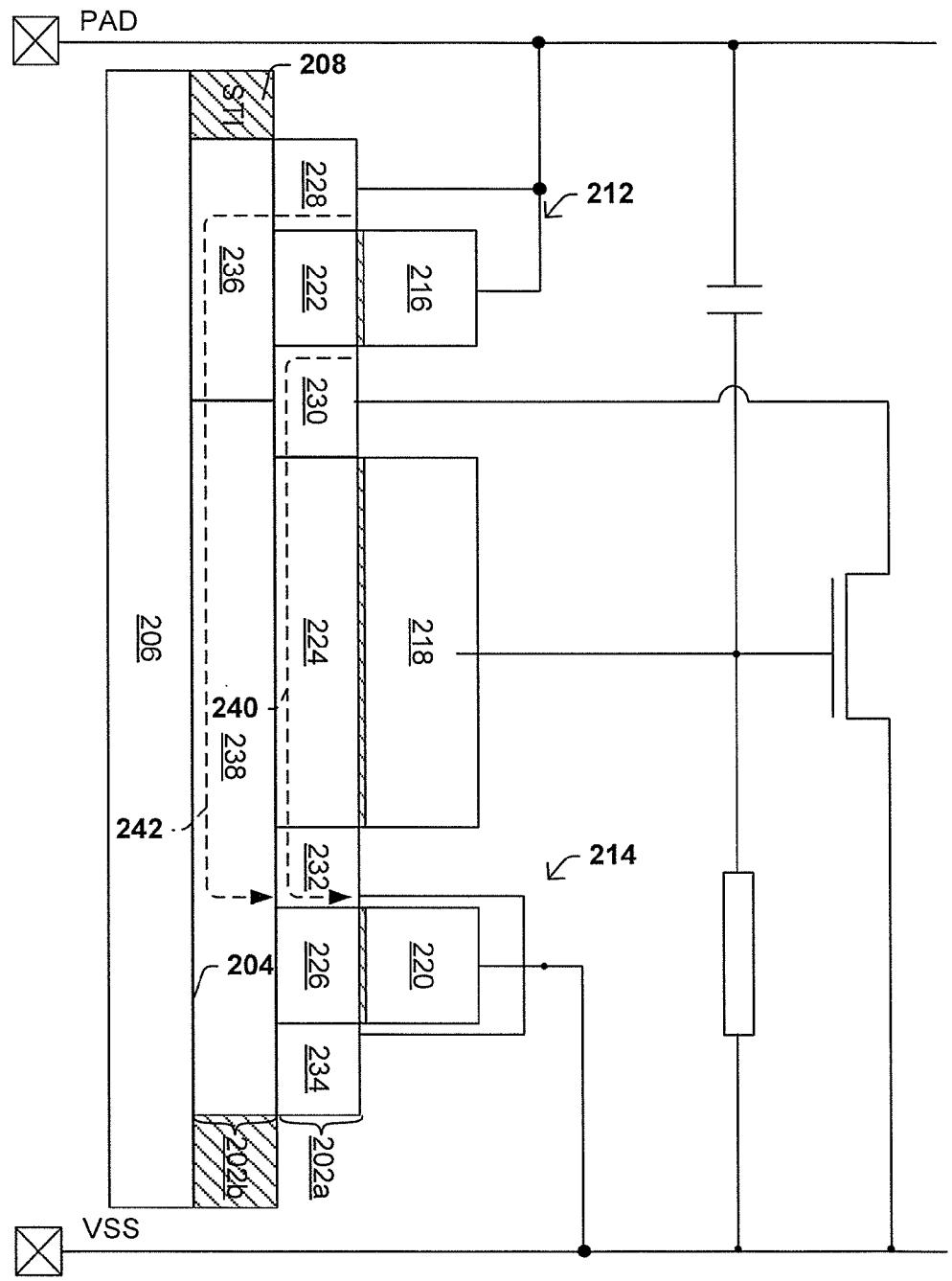
FIG. 2E shows the SCR of FIG. 2A arranged in a RC MOSFET triggered orientation for ESD protection.

FIG. 2E illustrates the SCR device 200 in a RC MOS triggered configuration. In this configuration, an RC trigger element, which includes an RC triggered MOS device (an NMOS device in this example), is arranged in parallel with the SCR current paths 240, 242. In this example, the first current path 240 provides reliable protection again human body model (HBM) type ESD events, while the second current path 242 offers reliable protection against charge device model (CDM) type ESD events. Therefore, overall the example in FIG. 2E offers robust ESD power clamp behavior.

Figure 3:
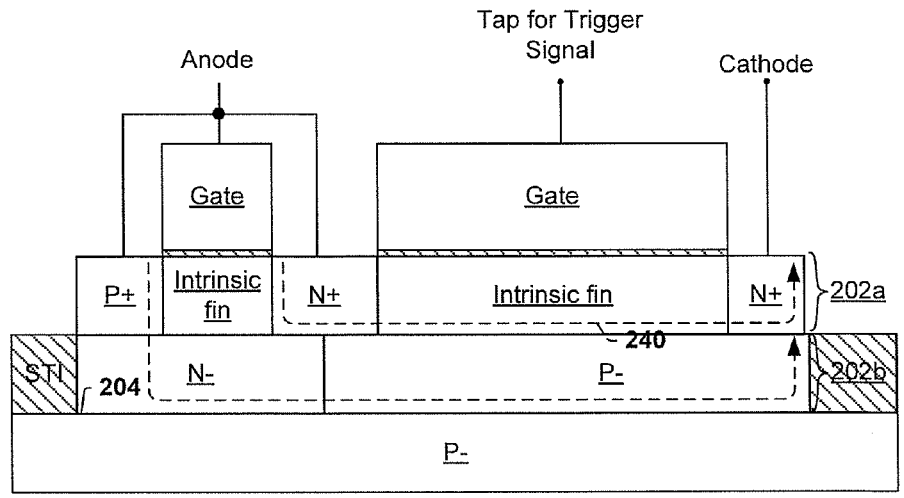
FIG. 3 shows an SCR device that includes two conductive gate electrodes.

FIG. 3 shows an SCR device that includes two conductive gate electrodes.

Figure 4:
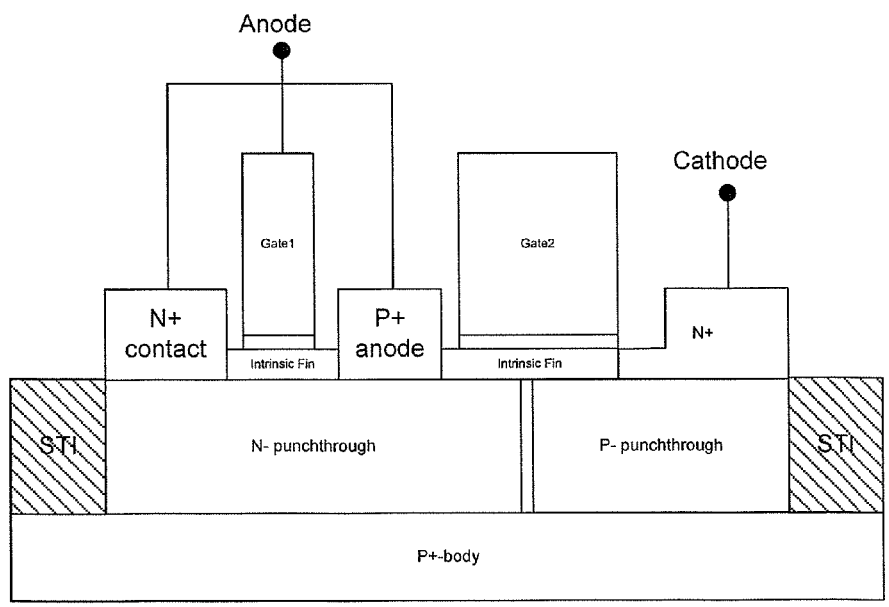
FIG. 4 shows an LDMOS SCR device in bulk FinFET technology that includes two conductive gate electrodes.

FIG. 4 shows an LDMOS SCR device in bulk FinFET technology that includes two conductive gate electrodes.

FIGS. 5A-5C through FIGS. 14A-14C show a series of cross-sectional views that illustrate a method of manufacturing an n-type FinFET. A p-type FinFET could also be manufactured in a similar manner by changing the doping types for the various layers. For each figure (e.g., FIG. 5), one view (e.g., FIG. 5B) shows a cross-sectional longitudinal view, and the other views (e.g., FIG. 5A, 5C) illustrate respective end views. Although these cross-sectional views show various structural features throughout the manufacturing method, it will be appreciated that there are many variations that can be used and this methodology is merely an example.

The method starts in FIG. 5A-5C when a semiconductor fin 502 has been formed over a semiconductor substrate 504. An STI region 506 laterally surrounds a base portion of the fin, while an upper portion of the fin remains above the STI region. A nitride mask 508 (or other hardmask) is formed over the fin. It will be appreciated that "semiconductor substrate" as referred to herein may comprise any type of semiconductor material including a bulk silicon wafer, a binary compound substrate (e.g., GaAs wafer), a ternary compound substrate (e.g., AlGaAs), or higher order compound wafers, among others. Further, the semiconductor substrate 804 can also include non-semiconductor materials such as oxide in silicon-on-insulator (SOI), partial SOI substrate, polysilicon, amorphous silicon, or organic materials, among others. In some instances, the semiconductor substrate 504 can also include multiple wafers or dies which are stacked or otherwise adhered together. The semiconductor substrate 504 can include wafers which are cut from a silicon ingot, and/or any other type of semiconductor/non-semiconductor and/or deposited or grown (e.g. epitaxial) layers formed on an underlying substrate.

In FIG. 6A-6C, a first hardmask 602 (e.g., a spacer nitride, photoresist, or other hardmask) is formed and patterned to cover a portion of the fin. While the patterned first hardmask 602 is in place, a p-type punch-through implant 604 is carried out to form first doped region 606 in base fin portion. In this implantation process, the ions are often directed perpendicularly towards the substrate. The first hardmask 602 blocks some ions from entering the fin, while other ions scatter off the STI region to be implanted into the fin under the upper surface of the STI region to form first doped region 606. See FIG. 6A. Although the first doped region 606 actually enables current flow in base fin portion, the first doped region 606 may also be referred to as a first punch-through blocking region 606 because the implant 604 is used to concurrently form punch through blocking regions for low voltage transistors (not shown) on substrate 504. Because first doped region 606 is formed concurrently with the punch-through blocking regions for low-voltage transistors (not shown), this manufacturing method can save a mask relative to other implementations where these regions are formed using separate masks.

Figures 7A, 7B, 7C:
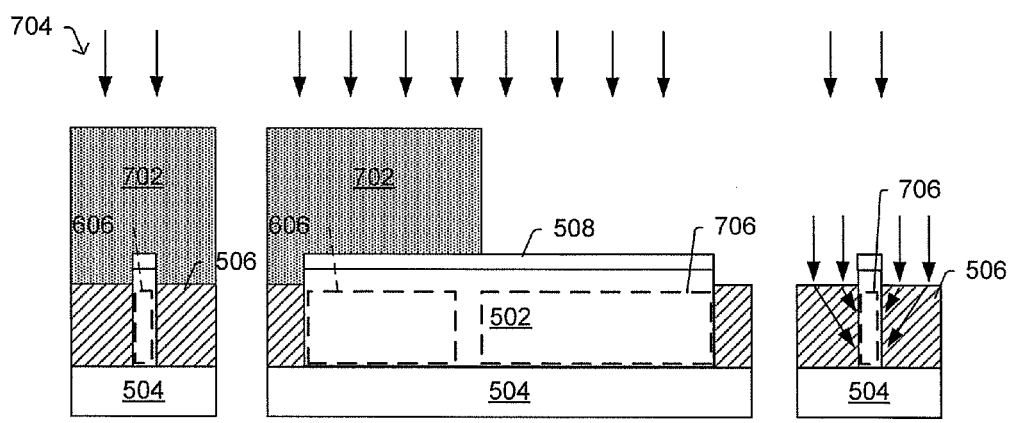
FIGS. 7A, 7B, and 7C show a cross-sectional end view, cross-sectional longitudinal view, and cross-sectional end view, respectively, illustrating at a stage of manufacture in accordance with some embodiments.
Figures 8A, 8B, 8C:
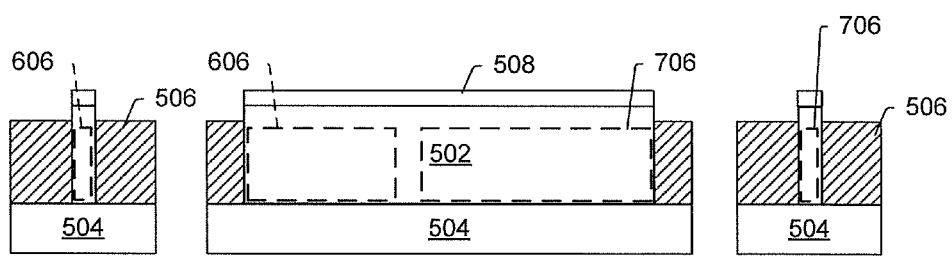
FIGS. 8A, 8B, and 8C show a cross-sectional end view, cross-sectional longitudinal view, and cross-sectional end view, respectively, illustrating at a stage of manufacture in accordance with some embodiments.

In FIG. 7A-7C, the first hard mask 602 is removed, and a second hardmask 702 is formed and patterned. While the second hardmask 702 is in place, another implant 704 is carried out to form second doped region 706 in the base fin portion. This implant 704 may also be referred to as an n-type punch-through implant, as it can concurrently be implanted into punch-through blocking regions of p-type low-voltage FinFETs (not shown) on semiconductor substrate 504. Again, the ions are often directed perpendicularly towards the substrate. The second hardmask 702 blocks some ions from entering the fin, while other ions scatter off the STI region to be implanted into the fin under the upper surface of the STI region to form second doped region 706. See FIG. 7C. FIG. 8A-8C shows the resultant structure after the second hardmask 702 has been removed.

In FIG. 9A-9C, the nitride mask is removed, and in FIG. 10A-10C a gate dielectric 1000 is formed and patterned over the fin. The gate dielectric 1000 can be made out of a high-k dielectric (high-k being relative to k of silicon dioxide, which could also be used for the gate dielectric). Illustrative high-k materials include hafnium silicate, zirconium silicate, hafnium dioxide and zirconium dioxide, and are typically deposited using atomic layer deposition.

In FIG. 11A-11C, a conductive gate electrode layer is formed over the structure, and is then patterned to form a gate electrode 1100. The gate electrode can be a metal gate electrode or a polysilicon gate electrode.

In FIG. 12A-12C, a third mask 1200 (e.g., nitride mask, photoresist, or other hardmask) is patterned. While the third mask 1200 is in place, ions are implanted to form an n-type regions 1202. In FIG. 13A-13C, the third hard mask is removed.

In FIG. 14A-14C, a fourth mask 1400 (e.g., nitride mask, photoresist, or other hardmask) is patterned. While the fourth mask 1400 is in place, ions are implanted to form p-type regions 1402.

Thus, it will be appreciated that some aspects of the present disclosure relate to a semiconductor device disposed on a semiconductor substrate. The device includes an STI region that laterally surrounds a base portion of a semiconductor fin. An anode region is arranged in the upper portion of the semiconductor fin and has a first conductivity type. A cathode region is arranged in the upper portion of the semiconductor fin and is spaced apart from the anode region. The cathode region has a second conductivity type, which is opposite the first conductivity type. A first doped base region is arranged in the base of the fin having the second conductivity type underneath the anode region. A second doped base region is arranged in the base of the fin having the first conductivity underneath the cathode region. A current control unit is arranged between the anode region and the cathode region. The current control unit is arranged to selectively enable and disable current flow in the upper portion of the fin based on a trigger signal.

Another aspect relates to a method of manufacturing a circuit structure. In this method, a shallow trench isolation (STI) region is formed over a semiconductor substrate. A semiconductor fin having a base fin portion and an upper fin portion, which are defined by a surface of the STI region, is then formed. A first doped region is formed in the lower fin portion by using a first implant having a first conductivity type. A second doped region is formed in the lower fin portion by using a second implant having a second conductivity type. A gate dielectric is formed over the semiconductor fin, and a gate electrode is formed over the gate dielectric. An anode is formed in the upper portion of semiconductor fin on a first side of the conductive gate electrode by using a third implant having the second conductivity type. The anode is formed over the first doped region. A cathode is formed in the upper portion of the semiconductor fin on a second, opposite side of the conductive gate electrode by using a fourth implant having the first conductivity type. The cathode is formed over the second doped region.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. Further, although the terms "first", "second" "third" and the like are used in this specification, it will be appreciated that such terms are merely generic identifiers and do not imply any spatial or temporal relationship between the various features. Also, although terms such as "upper", "lower", "above", and "below" are used herein, it is to be appreciated that no absolute reference frame (e.g., the ground beneath one's feet) is implied with respect to these and other similar terms. Rather, any coordinate frame can be selected for such terms. In addition, while a particular aspect may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A semiconductor device disposed on a semiconductor substrate, comprising:
    a shallow trench isolation (STI) region that laterally surrounds a base portion of a semiconductor fin, wherein the base portion of the semiconductor fin lies beneath an upper surface of the STI region and an upper portion of the semiconductor fin remains above the upper surface of the STI region;
    an anode region arranged in the upper portion of the semiconductor fin and having a first conductivity type;
    a cathode region arranged in the upper portion of the semiconductor fin and spaced apart from the anode region, the cathode region having a second conductivity type, which is opposite the first conductivity type;
    a first doped base region arranged at a first lateral position within the base portion of the semiconductor fin at a vertical position underneath the anode region, wherein the first doped base region has the second conductivity type;
    a second doped base region within the base portion of the semiconductor fin, wherein the second doped base region is arranged at a second lateral position such that no portion of the second doped base region vertically overlaps with the first lateral position, wherein the second doped base region has the first conductivity type; and
    a current control unit arranged between the anode region and the cathode region where the current control unit is arranged to selectively enable and disable current flow in the upper portion of the fin based on a trigger signal.

2. The semiconductor device of claim 1, wherein the current control unit includes at least two conductive gate electrodes arranged over the upper portion of the fin.

3. The semiconductor device of claim 1, wherein the current control unit is a doping region in the upper part of the fin.

4. The semiconductor device of claim 3, where the current control unit further comprises a conductive gate electrode arranged over the upper portion of the fin, wherein the doping region and conductive gate electrode cooperatively enable and disable current flow in the upper region of the fin based on the trigger signal.

5. The semiconductor device of claim 1, wherein the current control unit comprises:
    a first conductive gate electrode having a trigger circuit coupled thereto, the first conductive gate electrode traversing over the semiconductor fin between the anode region and cathode region to define a first channel region in the semiconductor fin under the first conductive gate electrode.

6. The semiconductor device of claim 1, wherein an implant is used to form the first or second doped base region concurrently with a punch-through blocking region in a low-voltage transistor on the semiconductor substrate.

7. The semiconductor device of claim 5, further comprising an intrinsic silicon region in the base portion of the semiconductor fin aligned under the conductive gate electrode between the first and second doped base regions.

8. The semiconductor device of claim 5, further comprising:
    a second conductive gate electrode traversing over the semiconductor fin between the first conductive gate electrode and the anode region.

9. The semiconductor device of claim 8, further comprising: a first doped upper fin region in the upper portion of the semiconductor fin between the first and second conductive gate electrodes, the first doped region having the second conductivity type.

10. The semiconductor device of claim 8, further comprising:
    a third conductive gate electrode traversing over the semiconductor fin between the first conductive gate electrode and the cathode region.

11. The semiconductor device of claim 10, further comprising: a second doped upper fin region in the upper fin portion next to the third gate electrode, wherein the third gate electrode is between the cathode and the second doped upper fin region.

12. The semiconductor device of claim 10, further comprising: an intrinsic silicon region under the third conductive gate electrode in the upper fin portion.

13. The semiconductor device of claim 10, wherein at least one of the conductive gate electrodes is a metal gate electrode.

14. The semiconductor device of claim 1,
    wherein the first doped base region extends a first length along the base portion of the semiconductor fin;
    wherein the second doped base region extends a second length along the base portion of the semiconductor fin; and
    wherein a sum of the first length and the second length is less than or equal to a length of the base portion of the semiconductor fin.

15. The semiconductor device of claim 1, further comprising:
    an intrinsic base region arranged within the base portion of the semiconductor fin at a position laterally disposed between the first doped base region and the second doped base region.

16. A semiconductor device disposed on a semiconductor substrate, comprising:
    a shallow trench isolation (STI) region that laterally surrounds a base portion of a semiconductor fin, wherein the base portion of the semiconductor fin lies beneath an upper surface of the STI region and an upper portion of the semiconductor fin remains above the upper surface of the STI region;
    an anode region arranged in the upper portion of the semiconductor fin and having a first conductivity type;
    a cathode region arranged in the upper portion of the semiconductor fin and spaced apart from the anode region, the cathode region having a second conductivity type, which is opposite the first conductivity type;
    a first doped base region arranged at a first lateral position within the base portion of the semiconductor fin at a vertical position underneath the anode region, wherein the first doped base region has the second conductivity type;
    a second doped base region within the base portion of the semiconductor fin, wherein the second doped base region is arranged at a second lateral position such that no portion of the second doped base region vertically overlaps with the first lateral position, wherein the second doped base region has the first conductivity type; and at least two conductive gate electrodes traversing over the semiconductor fin.

17. The semiconductor device of claim 15, further comprising:

an intrinsic upper fin region arranged within the upper portion of the semiconductor fin at a position laterally disposed between the anode region and the cathode region.

18. The semiconductor device of claim 17, wherein the intrinsic base fin region is disposed at a position that vertically underlies the intrinsic upper fin region.

19. The semiconductor device of claim 18, wherein the intrinsic upper fin region is disposed at a position that straddles an interface between the first doped base region and the second doped base region.

20. The semiconductor device of claim 16, wherein the first doped base region extends a first length along the base portion of the semiconductor fin;

wherein the second doped base region extends a second length along the base portion of the semiconductor fin; and wherein a sum of the first length and the second length is less than or equal to a length of the base portion of the semiconductor fin.

* * * * *